United States Patent
Kang et al.

(10) Patent No.: US 6,174,809 B1
(45) Date of Patent: Jan. 16, 2001

(54) METHOD FOR FORMING METAL LAYER USING ATOMIC LAYER DEPOSITION

(75) Inventors: Sang-bom Kang; Yun-sook Chae, both of Seoul; Chang-soo Park; Sang-in Lee, both of Kyungki-do, all of (KR)

(73) Assignee: Samsung Electronics, Co., Ltd., Suwon (KR)

( * ) Notice: Under 35 U.S.C. 154(b), the term of this patent shall be extended for 0 days.

(21) Appl. No.: 09/212,090

(22) Filed: Dec. 15, 1998

(30) Foreign Application Priority Data

Dec. 31, 1997 (KR) .................................................. 97-82126
Jun. 16, 1998 (KR) .................................................. 98-22577

(51) Int. Cl.$^7$ .................................................. H01L 21/44
(52) U.S. Cl. .......................................... 438/682; 438/721
(58) Field of Search ..................... 29/571, 578; 148/518, 148/362, 643; 437/41, 247, 949; 438/682, 290, 174, 180, 20, 421, 688, 721

(56) References Cited

U.S. PATENT DOCUMENTS

| | | | |
|---|---|---|---|
| 4,470,189 | * 9/1984 | Roberts et al. | 29/571 |
| 4,943,539 | * 7/1990 | Wilson et al. | 437/195 |
| 5,679,585 | * 10/1997 | Gardner et al. | 437/41 |
| 5,718,618 | * 2/1998 | Guckel et al. | 451/41 |
| 5,880,026 | * 3/1999 | Xing et al. | 438/688 |
| 5,918,130 | * 6/1999 | Hause et al. | 438/290 |
| 5,930,590 | * 7/1999 | Busta | 438/20 |
| 5,951,791 | * 9/1999 | Bell et al. | 148/518 |
| 6,008,064 | * 12/1999 | Busta | 438/20 |

* cited by examiner

Primary Examiner—David Nelms
Assistant Examiner—Phuc T. Dang
(74) Attorney, Agent, or Firm—Marger Johnson & McCollom, P.C.

(57) ABSTRACT

A method for forming a metal layer using an atomic layer deposition process. A sacrificial metal atomic layer is formed on a semiconductor substrate by reacting a precursor containing a metal with a reducing gas, and a metal atomic layer is formed of metal atoms separated from a metal halide gas on a semiconductor substrate by reacting the sacrificial metal atomic layer with a metal halide gas. Also, a silicon atomic layer may be additionally formed on the metal atomic layer using a silicon source gas, to thereby alternately stack metal atomic layers and silicon layers. Thus, a metal layer or a metal silicide layer having excellent step coverage can be formed on the semiconductor substrate.

25 Claims, 7 Drawing Sheets

METHOD FOR FORMING METAL LAYER USING ATOMIC LAYER DEPOSITION

BACKGROUND OF THE INVENTION

1. Field of the Invention

The present invention relates to a method for forming a metal layer, and more particularly, to a method for forming a metal layer using atomic layer deposition.

2. Description of the Related Art

As the integration of a semiconductor device increases, the design rule is reduced. Thus, the aspect ratio of a contact hole becomes higher, but the junction depth becomes shallower. The junction depth directly depends on a short channel effect of a MOS transistor. That is, a MOS transistor appropriate for a highly-integrated semiconductor device requires a short channel length, and the depth of a source/drain region, i.e., the junction depth, must be shallow to improve the characteristics of the MOS transistor having the short channel. An interconnection technology for connecting the shallow junction to a metal interconnection requires a barrier metal layer. This prevents the metal interconnection from penetrating into the shallow junction, i.e., prevents a junction spiking phenomenon. A titanium nitride (TiN) layer is widely used for the barrier metal layer, and an ohmic layer, e.g., a titanium silicide layer, is interposed between the barrier metal layer and the junction. The titanium silicide layer has a melting point of 1540° C., a resistivity of 13~16 $\mu$U-cm and a barrier height of 0.6eV with respect to an N-type impurity layer, and is widely used for the ohmic layer of the interconnection. The titanium silicide layer used for the ohmic layer is formed by forming a titanium layer on the junction, i.e., a silicon substrate (impurity layer) doped with an impurity, and then annealing to react the titanium layer with the silicon substrate.

As described above, in a conventional method for forming the metal interconnection, an interdielectric layer is formed on an impurity layer, and the interdielectric layer is patterned to form a contact hole exposing a predetermined region of the impurity layer. The ohmic layer, the barrier metal layer and the metal interconnection are formed in sequence on the entire surface of the resultant structure where the contact hole is formed. Here, the ohmic layer can be obtained by forming a titanium layer on the exposed impurity layer and annealing the titanium layer, or forming the titanium silicide layer directly on the impurity layer. The titanium suicide layer must be formed at a temperature low enough to avoid damage to the impurity layer. Thus, there has been proposed a method for forming a titanium silicide layer using plasma-enhanced chemical vapor deposition (PECVD), in "Plasma Enhanced CVD of Blanket TiSi$_2$ on Oxide Patterned Wafer" by J. Lee et al., *J. Electrochem. Soc.*, vol. 139, No. 4 1992, pp. 1159–1165, and in "Material characterization of plasma-enhanced CVD titanium silicide", by Alan E. Morgan et al., *J. Vac. Sci. Technol.* B4(3), 1986, pp. 723–731. However, when the titanium silicide layer is formed on the contact hole having a high aspect ratio in a highly-integrated semiconductor device, the titanium silicide layer shows poor step coverage due to the plasma characteristics. Meanwhile, a method for forming a titanium silicide layer using a low pressure CVD (LPCVD) process at 600V C. or higher has been proposed by V. llderem et al. and G. J. Reynolds et al. (see "Optimized Deposition Parameters for Low pressure CVD titanium silicide", *J. Electrochem. Soc.*, 1988, pp. 2590–2596 and "Selective titanium disilicide by Low Pressure CVD", *J. Appl. Phys.* 65(8), 1989, pp. 3212–3218). However, when the titanium silicide layer is formed at 600° C. or higher, silicon consumption of the impurity layer contacting the titanium layer is increased, deteriorating junction leakage current characteristics. Thus, it is difficult to adapt the LPCVD titanium silicide layer to be suitable for a highly-integrated semiconductor device requiring a shallow junction.

SUMMARY OF THE INVENTION

It is an objective of the present invention to provide a method for forming a metal layer having improved step coverage at 500° C. or lower, using atomic layer deposition.

Accordingly, according to one aspect of the present a sacrificial metal atomic layer is formed on a semiconductor substrate. The sacrificial metal atomic layer reacts with a metal halide gas, thereby removing the sacrificial metal atomic layer and simultaneously forming a metal atomic layer of metal atoms separated from the metal halide gas. The semiconductor substrate is a silicon substrate, and has a predetermined surface region on which a junction doped with an impu is formed, i.e., an impurity layer. Other embodiments include a patterned interdielectric layer having a contact hole exposing a predetermined region of the impurity layer. The sacrificial metal atomic layer and the metal atomic layer are formed in sequence at least once on an initial sacrificial metal atomic layer, which is a sacrificial metal atomic layer initially formed on the semiconductor substrate, to thereby form a metal layer consisting of a plurality of metal atomic layers on the semiconductor substrate. Here, the initial sacrificial metal atomic layer, which is the sacrificial metal atomic layer initially formed on the semiconductor substrate, must be formed such that the entire surface of the exposed impurity layer is completely covered. If the surface of the impurity layer exposed by the contact hole is not completely covered with the initial sacrificial metal atomic layer, the metal halide gas reacts with and damages the impurity layer. Thus, an initial sacrificial metal layer completely covering the entire surface of the impurity layer may be formed prior to forming the initial sacrificial metal atomic layer. At this time, preferably, while the initial sacrificial metal layer is formed, the semiconductor substrate is heated to no more than 500° C., preferably to 300~500° C. The initial sacrificial metal layer is formed of the same material as the sacrificial metal atomic layer. The initial sacrificial metal layer or the sacrificial metal atomic layer is formed by reacting the sacrificial metal source gas with a reducing gas. Here, preferably, H$_2$ gas or SiH$_4$ gas is used for the reducing gas.

Meanwhile, the metal halide gas must have a Gibbs free energy lower than that of a composition including a metal atom of the sacrificial metal atomic layer and a halogen atom of the metal halide gas. In other words, the metal atoms of the sacrificial metal atomic layer must be capable of being combined with halogen atoms instead of the combination of the metal atoms of the metal halide with halogen atoms. For instance, in order to form a metal atomic layer formed of titanium on the semiconductor substrate, the metal halide preferably employs TiCl$_4$ gas, TiI$_4$ gas, TiBr$_4$ gas or TiF$_4$ gas. At this time, if the metal halide is TiCl$_4$ gas, then the sacrificial metal atomic layer is preferably an Al layer, a La layer, a Pr layer, an In layer, a Ce layer, a Nd layer or a Be layer. This is because the Gibbs free energy of TiCl$_4$ gas is lower than that of Al$_2$Cl$_6$, LaCl$_3$ gas, PrCl$_3$ gas, In$_2$Cl$_6$ gas, CeCl$_3$ gas, NdCl$_3$ gas and Be$_2$Cl$_4$ gas. Similarly, if the TiI$_4$ gas is used for the metal halide in order to form a metal atomic layer formed of titanium on the semiconductor substrate, then preferably, the sacrificial metal atomic layer is an Al layer, a Zr layer or a Hf layer. This is because the Gibbs free energy of $TiI_4$ gas is lower than that of $Al_2I_6$ gas, $ZrI_4$ gas and $HfI_4$ gas.

Various metal halide gases, e.g., $TaCl_5$ gas, $TaI_5$ gas, $TaBr_5$ gas, $TaF_5$ gas, $HfCl_4$ gas, $HfI_4$ gas, $HfBr_4$ gas, $HfF_4$ gas, $ZrCl_4$ gas, $ZrI_4$ gas, $ZrBr_4$ gas or $ZrF_4$ gas may be used according to the type of metal atomic layer to be formed on the semiconductor substrate.

As described above, if the metal halide gas is supplied to the surface of the resultant structure where the sacrificial metal atomic layer is formed or where the initial sacrificial metal layer and the initial sacrificial metal atomic layer are formed, then metal atoms in the sacrificial metal atomic layer and the metal atoms in the initial sacrificial metal layer combine with the halogen atoms of the metal halide gas, generating a volatile gas. Thus, the metal atoms in the metal halide, e.g., transition metal atoms, are deposited on the semiconductor substrate, to form a metal atomic layer. Preferably, when the sacrificial metal atomic layer and the metal atomic layer are formed in sequence, the semiconductor substrate is heated to 500° C., preferably to 300~500° C.

According to another aspect of the present invention to achieve the objective, a sacrificial metal atomic layer and a metal atomic layer are formed on a semiconductor substrate in the same manner as in the first aspect, and a silicon atomic layer is formed on the metal atomic layer. Here, an initial sacrificial metal layer can be formed on the semiconductor substrate like the first aspect, before an initial sacrificial metal atomic layer, which is a layer initially formed on the semiconductor substrate, is formed. Next, the sacrificial metal atomic layer, the metal atomic layer and a silicon atomic layer are stacked in sequence at least once on the resultant structure where the initial silicon atomic layer is formed, to thereby alternately stack a plurality of metal atomic layers and a plurality of silicon atomic layers on the semiconductor substrate. At this time, when the thickness of each metal atomic layer and each silicon atomic layer are appropriately controlled, a metal silicide layer having a desired composition ratio may be formed. While the silicon atomic layer is formed, the semiconductor substrate is heated to 500° C., preferably to 300~500° C. The silicon atomic layer is formed using a silicon source gas, i.e., a precursor containing silicon atoms.

According to the present invention, a metal layer or a metal suicide layer having excellent step coverage may be formed at 500° C. or lower on the surface of the semiconductor substrate having a contact hole with a high aspect ratio. Thus, when manufacturing a highly-integrated semiconductor device requiring a shallow junction, a very reliable conductive layer, i.e., a barrier metal layer or an ohmic layer, may be formed.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

The present invention now will be described more fully hereinafter with reference to the accompanying drawings. This invention may, however, be embodied in many different forms and should not be construed as being limited to the embodiments set forth herein. Rather, these embodiments are provided so that this disclosure will be thorough and complete, and will fully convey the concepts of the invention to those skilled in the art.

Figure 5:
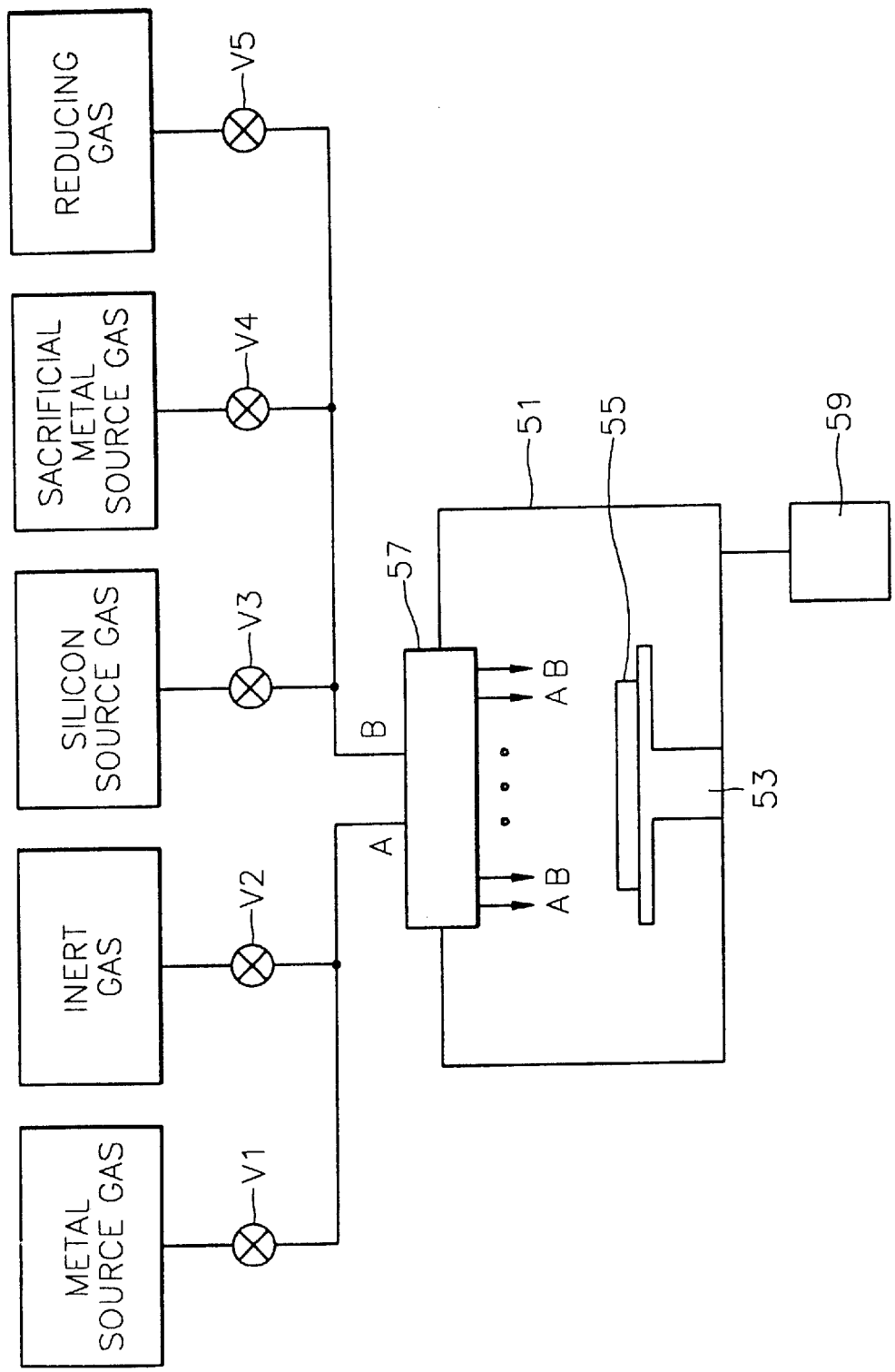
FIG. 5 is a schematic view of an apparatus for forming a metal layer, used for embodiments of the present invention.

Referring to FIG. 5, an apparatus used to form a metal layer according to the present invention includes a reaction chamber 51, a susceptor 53 installed on the bottom of the reaction chamber 51 to hold a semiconductor substrate 55, a shower head 57 installed over the susceptor 53 to inject a reaction gas into the reaction chamber 51, and a vacuum pump 59 connected to the reaction chamber 51 to control the pressure in the reaction chamber 51. Here, the shower head 57 includes two gas inlets A and B separated from each other. A metal source gas and an inert gas are injected into the reaction chamber 51 through the gas inlet A, and a silicon source gas, a sacrificial metal source gas and a reducing gas are injected into the reaction chamber 51 through the gas inlet B. This is to suppress the reaction of gases in one of the inlets A and B before arriving in the chamber 51. The injection of the metal source gas and the inert gas into the gas inlet A is controlled by first and second valves V1 and V2 respectively, and the injection of the silicon source gas, the sacrificial metal source gas and the reducing gas into the gas inlet B is controlled by third, fourth and fifth valves V3, V4 and V5 respectively. Also, a $H_2$ remote plasma generator 61 capable of injecting $H_2$ remote plasma into the chamber 51 is installed. The $H_2$ remote plasma generator 61 is composed of a chamber separate from the chamber 51, and which can generate $H_2$ plasma. In other words, the $H_2$ remote plasma generator 61 can generate $H_2$ plasma in other chamber and inject the $H_2$ plasma into the chamber 51.

Figure 1:
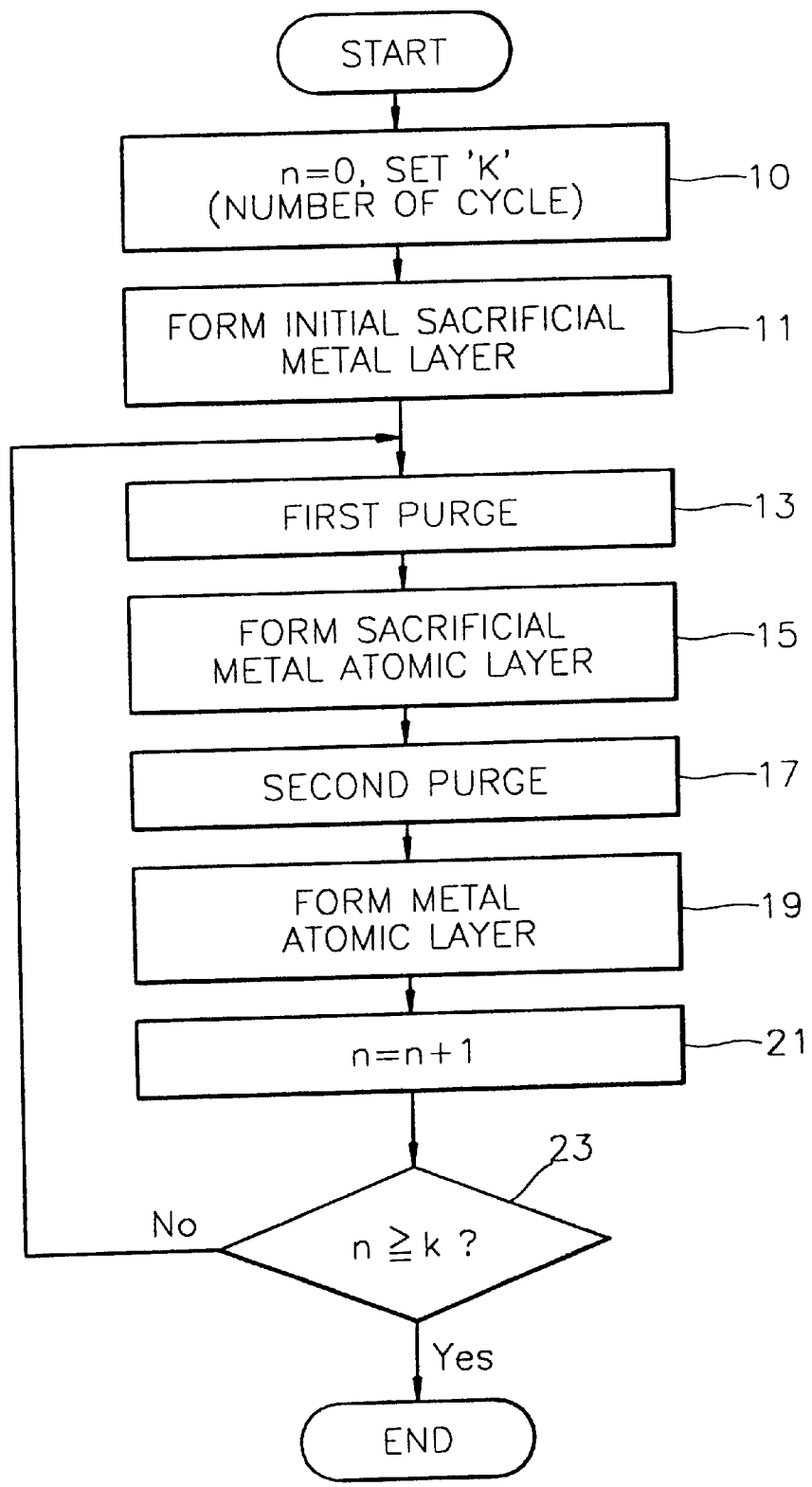
FIG. 1 is a flowchart illustrating the process sequence of one embodiment of the present invention.
Figure 2:
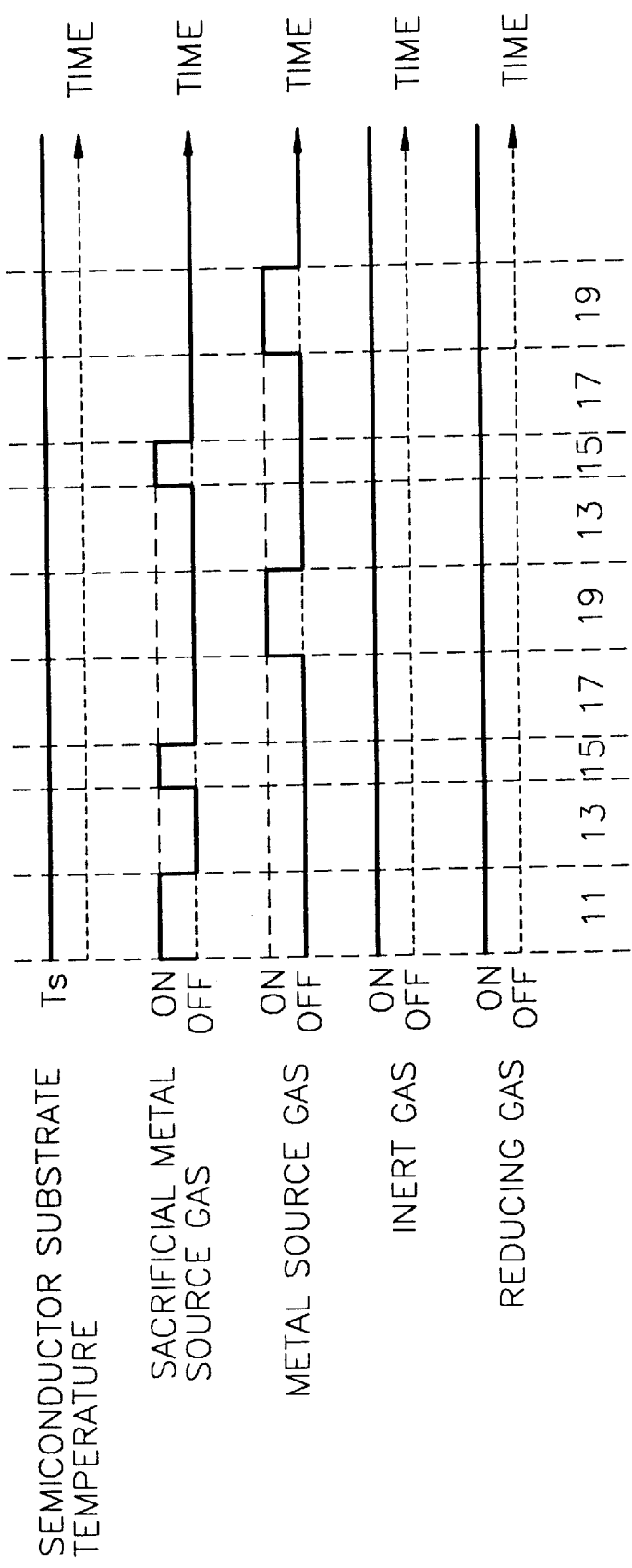
FIG. 2 is a timing diagram illustrating one embodiment of the present invention.

In one embodiment of the present invention, described with reference to FIGS. 1, 2 and 5, a junction doped with an impurity, i.e., an impurity layer, is formed on the semiconductor substrate, e.g., the surface of a predetermined region of a silicon substrate. The impurity layer corresponds to a source/drain region of a MOS transistor, and must be formed to a depth of 0.1 $\mu m$ or less for a highly integrated semiconductor device. This is because the short channel effect of the MOS transistor is closely related to the junction depth. That is, as the junction depth of the impurity layer is shallower, the short channel effect of the MOS transistor is improved. An interdielectric layer is formed on the entire surface of the resultant structure where the impurity layer is formed, and the interdielectric layer is patterned to form a contact hole exposing a predetermined region of the impurity layer. At this time, as the integration of the semiconductor device increases, the thickness of the interdielectric layer increases and the diameter of the contact hole decreases. Thus, as the integration of the semiconductor device increases, the aspect ratio of the contact hole increases. The semiconductor substrate 55 where the contact hole is formed is loaded on the susceptor 53 in the reaction chamber of the apparatus for forming a metal layer. Also, in a process recipe, a value n is initialized to zero and at the same time a value k indicating the number of desired process cycles is determined (step 10).

Subsequently, if the temperature Ts of the semiconductor substrate 55 is controlled to 300~500° C., second, fourth and fifth valves V2, V4 and V5 are opened, so that the inert gas, the sacrificial metal source gas and the reducing gas are injected into the chamber 51 for a predetermined time, to thereby form an initial sacrificial metal layer on the entire surface of the semiconductor substrate 55 where the contact hole is formed (step 11). The sacrificial metal source gas and the reducing gas mix with each other in the gas inlet B, but do not react with each other due to the low temperature of 100~150° C. in the gas inlet B. At this time, the pressure in the reaction chamber 51 is controlled to approximately 3 torr. Preferably, the initial sacrificial metal layer is a metal layer capable of easily reacting with a metal source gas used to form a desired metal atomic layer in a subsequent process, i.e., a metal-halide gas consisting of a transition metal and a halogen element. For instance, in order to form a titanium layer as metal atomic layer, preferably a metal halide containing titanium, i.e., $TiCl_4$ gas, $TiI_4$ gas, $TiBr_4$ gas, or $TiF_4$ gas, is desirable for the metal halide gas. Also, if $TiCl_4$ gas is used for the metal halide gas, an Al layer, a La layer, a Pr layer, an In layer, a Ce layer, a Nd layer or a Be layer are desirable for the initial sacrificial metal layer. At this time, the Al layer is most preferable for the initial sacrificial metal layer. This is because aluminum has the highest Gibbs free energy with respect to Cl and various precursors, as shown in Table 1a. Preferably, argon gas or nitrogen gas is used for the inert gas, and hydrogen gas is used for the reducing gas. The reducing gas reduces the sacrificial metal source gas. The Gibbs free energy of various metal halide gases at an absolute temperature of 700°K (427° C.) is shown in Tables 1a, 1b, 2, 3, and 4.

TABLE 1a

Gibbs free energy of various metal halide gases containing chlorine at 427° C.

| Compound | Gibbs free energy (kJ/mol) | Compound | Gibbs free energy (kJ/mol) | Compound | Gibbs free energy (kJ/mol) |
|---|---|---|---|---|---|
| $Al_2Cl_6$ | −1121.9 | $HfCl_3$ | −626.7 | $BeCl_2$ | −373.1 |
| $ThCl_4$ | −895.8 | $EuCl_3$ | −621.6 | $BCl_3$ | −367.7 |
| $UCl_5$ | −811.9 | $YbCl_3$ | −621.5 | $SiCl_3$ | −365.7 |
| $HfCl_4$ | −804.7 | $K_2Cl_2$ | −609.8 | $SnCl_4$ | −362.3 |
| $ZrCl_4$ | −777.6 | $Rb_2Cl_2$ | −607.6 | $InCl_3$ | −335.8 |
| $LaCl_3$ | −708.9 | $Li_2Cl_2$ | −597.8 | $AlCl_2$ | −305.5 |
| $PrCl_3$ | −706.9 | $SiCl_4$ | −569.6 | $TaCl_3$ | −300.1 |
| $In_2Cl_6$ | −703.7 | $AlCl_3$ | −550.1 | $GeCl_3$ | −299.8 |
| $CeCl_3$ | −699.5 | $Fe_2Cl_6$ | −526.8 | $MnCl_2$ | −286.4 |
| $NdCl_3$ | −696.6 | $BaCl_2$ | −524.3 | $WCl_5$ | −285.6 |
| $Be_2Cl_4$ | −692.6 | $SrCl_2$ | −498.1 | $CsCl$ | −276.7 |
| $TiCl_4$ | −678.3 | $TaCl_4$ | −497.5 | $ZnCl_2$ | −273.5 |
| $GdCl_3$ | −674.3 | $CaCl_2$ | −489.1 | $WCl_4$ | −267.6 |
| $TbCl_3$ | −668.1 | $PbCl_4$ | −462.1 | $Ti_2Cl_2$ | −259.8 |
| $HoCl_3$ | −659.7 | $VaCl_4$ | −447.2 | $GaCl_2$ | −258.4 |
| $ErCl_3$ | −651.7 | $GeCl_4$ | −410.8 | $SbCl_5$ | −249.9 |
| $Cs_2Cl_2$ | −644.1 | $MgCl_2$ | −407.8 | $Cu_3Cl_3$ | −242.9 |
| $TmCl_3$ | −641.5 | $Fe_2Cl_4$ | −406.5 | $PCl_3$ | −242.3 |
| $TaCl_5$ | −636.6 | $GaCl_3$ | −388.6 | $FeCl_3$ | −240.6 |

TABLE 1b

Gibbs free energy of various metal halide gases containing chlorine at 427° C.

| Compound | Gibbs free energy (kJ/mol) | Compound | Gibbs free energy (kJ/mol) | Compound | Gibbs free energy (kJ/mol) |
|---|---|---|---|---|---|
| $InCl_2$ | −240.2 | $CaCl$ | −165.1 | $NiCl_2$ | −101.8 |
| $BiCl_3$ | −238.5 | $TeCl_4$ | −136.4 | $HCl$ | −98.7 |
| $AsCl_3$ | −231.4 | $HgCl_2$ | −136.2 | $SeCl_2$ | −50.5 |
| $SnCl_2$ | −215.8 | $TeCl_2$ | −134.6 | $BiCl$ | −30.9 |
| $BaCl$ | −198.5 | $CoCl_2$ | −125.2 | $BeCl$ | −6.2 |
| $SiCl_2$ | −195.5 | $GaCl$ | −123.1 | $AgCl$ | 29.6 |
| $SrCl$ | −181.5 | $AlCl$ | −111.6 | $BCl$ | 74.3 |
| $FeCl_2$ | −174.5 | $BCl_2$ | −109.9 | $SiCl$ | 123.7 |

TABLE 2

Gibbs free energy of various metal halide gases containing iodine at 427° C.

| Compound | Gibbs free energy (kJ/mol) | Compound | Gibbs free energy (kJ/mol) | Compound | Gibbs free energy (kJ/mol) |
|---|---|---|---|---|---|
| $ThI_4$ | −512 | $ZrI_4$ | −409 | $TiI_4$ | −320 |
| $Al_2I_6$ | −510 | $HfI_4$ | −405 | $PbI_4$ | −266 |
| $K_2I_2$ | −480 | $DyI_3$ | −402 | $MgI_2$ | −239 |
| $LaI_3$ | −457 | $TmI_3$ | −399 | $CuI$ | −237 |
| $PrI_3$ | −448 | $GdI_3$ | −388 | $CsI$ | −220 |
| $CeI_3$ | −442 | $BaI_2$ | −380 | $TaI_5$ | −202 |
| $NdI_3$ | −438 | $UI_4$ | −377 | $SiI_4$ | −150 |
| $Li_2I_2$ | −427 | $SrI_2$ | −353 | $HI$ | −11.8 |
| $ErI_3$ | −410 | $CaI_2$ | −338 | — | — |

TABLE 3

Gibbs free energy of various metal halide gases containing bromine at 427° C.

| Compound | Gibbs free energy (kJ/mol) | Compound | Gibbs free energy (kJ/mol) | Compound | Gibbs free energy (kJ/mol) |
|---|---|---|---|---|---|
| $Al_2Br_6$ | −860 | $HoBr_3$ | −567 | $CaBr_2$ | −435 |
| $Mg_2Br_4$ | −764 | $ErBr_3$ | −566 | $PbBr_4$ | −428 |
| $ThBr_4$ | −743 | $TmBr_3$ | −563 | $TaBr_5$ | −424 |
| $HfBr_4$ | −639 | $TbBr_3$ | −559 | $EuBr_2$ | −413 |
| $ZrBr_4$ | −627 | $DyBr_3$ | −559 | $SiBr_4$ | −387 |
| $LaBr_3$ | −621 | $GdBr_3$ | −551 | $Cu_3Br_3$ | −187 |
| $CeBr_3$ | −616 | $Li_2Br_2$ | −534 | $WBr_6$ | −139 |
| $PrBr_3$ | −612 | $TiBr_4$ | −527 | $HBr$ | −58.6 |
| $UBr_4$ | −602 | $Na_2Br_2$ | −510 | — | — |
| $NdBr_3$ | −598 | $SrBr_2$ | −453 | — | — |

TABLE 4

Gibbs free energy of various metal halide gases containing fluorine at 427° C.

| Compound | Gibbs free energy (kJ/mol) | Compound | Gibbs free energy (kJ/mol) | Compound | Gibbs free energy (kJ/mol) |
|---|---|---|---|---|---|
| $Al_2F_6$ | −2439 | $HfF_4$ | −1592 | $Li_3F_3$ | −1457 |
| $UF_6$ | −1958 | $ZrF_4$ | −1587 | $PrF_3$ | −1231 |
| $TaF_5$ | −1687 | $S_2F_{10}$ | −1581 | $AsF_5$ | −1080 |
| $ThF_4$ | −1687 | $SiF_4$ | −1515 | $CuF_2$ | −287.3 |
| $Mg_2F_4$ | −1624 | $WF_6$ | −1513 | $HF$ | −277.1 |
| $NbF_5$ | −1607 | $TiF_4$ | −1467 | — | — |

A metal source gas and an initial sacrificial metal layer appropriate for forming a desired metal atomic layer on a semiconductor substrate can be selected from Tables 1 through 4. For instance, in order to form a titanium atomic layer as a metal atomic layer, an Al layer, a La layer, a Pr layer, an In layer, a Ce layer, a Nd layer or a Be layer is desirable for the initial sacrificial metal layer, and $TiCl_4$ gas is desirable as the metal source gas. Preferably, the sacrificial metal source gas for forming an Al initial sacrificial metal layer is a precursor containing Al, e.g., $(C_4H_9)_{2AlH}$, $(C_4H_9)_{3AlH}$, $(C_2H_5)_3Al$, $(CH_3)_3Al$, $AlH_3N(CH_3)_3$, $(CH_3)_2AlH$, or $(CH_3)_2C_2H_5N:AlH_3$. It is preferable that the sacrificial metal source gas for forming an La initial sacrificial metal layer is a precursor containing La, e.g., $(C_5H_5)_3La$ or $(C_2H_7C_4H_4)_3La$, and the sacrificial metal source gas for forming a Pr initial sacrificial metal layer is a precursor containing Pr, such as $(C_5H_5)_3Pr$ or $(C_3H_7C_5H_4)_3Pr$. It is preferable that the sacrificial metal source gas for forming an In initial sacrificial metal layer is a precursor containing In, e.g., $C_2H_5In$, $(CH_3)_5C_5In$, $(C_2H_5)_3In$ or $(CH_3)_3In$. It is preferable that the sacrificial metal source gas for forming a Ce initial sacrificial metal layer is a precursor containing Ce, e.g., $(C_5H_5)_3Ce$ or $((C_5H_5)C_5H_4)_3Ce$. It is preferable that the sacrificial metal source gas for forming an Nd initial sacrificial metal layer is a precursor containing Nd, e.g., $(C_5H_5)_3Nd$ or $(C_3H_7C_5H_4)_3Nd$. It is preferable that the sacrificial metal source gas for forming a Be initial sacrificial metal layer is a precursor containing Be, e.g., $Be(C_2H_5)_2$. The precursor containing Al is most preferable sacrificial metal source gas. This is because Al has a Gibbs free energy higher than any other transition element, with halogen atoms, e.g., Cl, I, Br or F as shown in Tables 1 through 4, and various precursors as described above.

If an Al initial sacrificial metal layer is formed, then, TMA( trymethyl aluminum; $((CH_3)_3Al)$) is a typical precursor for the sacrificial metal source gas. At this time, the $H_2$ gas, which is the reducing gas, reacts with the TMA gas so that $CH_3$ of the TMA gas is changed to $CH_4$. The $CH_4$ is exhausted from the reaction chamber 51 and the Al atoms are deposited on the surface of the semiconductor substrate to form the Al layer.

Next, $H_2$ remote plasma is injected around the resultant structure where the initial sacrificial metal layer is formed, through the $H_2$ remote plasma generator 61, to thereby completely remove the remnants of CHx separated from the sacrificial metal source gas and remaining in the chamber (step 12). Here, the $H_2$ remote plasma is generated in a chamber separated from the chamber in which the reaction is performed. Thus, CHx can be removed more completely than in the case of using $H_2$ gas, to thereby form a pure initial sacrificial metal layer, and thus a pure subsequent metal atomic layer.

The chamber may be purged with an inert gas or $H_2$ gas before the step of injecting the remote plasma, to thereby remove remnants separated from the sacrificial metal source gas, even though this is not described in this embodiment.

Subsequently, a peripheral portion of the resultant structure where the initial sacrificial metal layer is formed is purged by the inert gas, to completely exhaust the sacrificial metal source gas remaining in the reaction chamber 51 (step 13), (a first purge process.) The reducing gas may be supplied during the first purge process. The temperature of the semiconductor substrate is maintained at 300~500° C. Here, the temperature of the semiconductor substrate while forming the initial sacrificial metal layer may be controlled to be equal to or different from the temperature of the semiconductor substrate during the first purge process.

After completion of the first purge process, the sacrificial metal source gas, the reducing gas and the inert gas are injected into the reaction chamber 51 to react the sacrificial metal source gas with the reducing gas, so that a sacrificial metal atomic layer is formed on the initial sacrificial metal layer (step 15). For instance, if $TMA((CH_3)_3Al)$ gas and $H_2$ gas are used for the sacrificial metal source gas and the reducing gas, respectively, an Al layer is formed as a sacrificial metal atomic layer. Here, the sacrificial metal atomic layer is formed of the same material as the initial sacrificial metal layer. For instance, if the initial sacrificial metal layer is an Al layer, the sacrificial metal atomic layer is also formed of Al. Also, the sacrificial metal atomic layer is formed using the same sacrificial metal source gas as that used to form the initial sacrificial metal layer. At this time, preferably, the thickness of the sacrificial metal atomic layer is 4~5A. Here, when the entire surface of the exposed impurity layer is covered with the sacrificial metal atomic layer, the process of forming the initial sacrificial metal layer may be omitted. In other words, the initial sacrificial metal layer is for preventing the metal source gas injected into the reaction chamber 51 during formation of the metal atomic layer from reacting with silicon atoms in the impurity layer.

Then, $H_2$ remote plasma from the $H_2$ remote plasma generator 61 is injected around the resultant structure where the sacrificial metal layer is formed, to thereby completely remove the remnants of CHx separated from the sacrificial metal source gas and remaining in the chamber (step 16). Here, the $H_2$ remote plasma is generated in a chamber separated from the chamber in which the reaction is performed. Thus, CHx can be removed more completely than in the case of using $H_2$ gas, to thereby form a pure sacrificial metal layer, and thus a pure subsequent metal atomic layer.

The chamber may be purged with an inert gas or $H_2$ gas before the step of injecting the remote plasma, to thereby remove remnants separated from the sacrificial metal source gas, even though this is not described in this embodiment.

The peripheral portion of the resultant structure where the sacrificial metal layer is formed is purged with the inert gas, to completely exhaust the sacrificial metal source gas remaining in the reaction chamber 51 (step 17), (a second purge process.) The reducing gas may be supplied during the second purge process. After completion of the second purge process, the metal source gas, the inert gas and the reducing gas are injected into the reaction chamber 51, to thereby remove the sacrificial metal atomic layer and the initial sacrificial metal layer and simultaneously form a metal atomic layer on the entire surface of the semiconductor substrate (step 19). At this time, preferably, a metal halide gas containing metal atoms of a metal layer to be formed, e.g., $TiCl_4$, is used for the metal source gas. The inert gas, e.g., $N_2$ gas or Ar gas, is a carrier gas of the metal source gas, i.e., the metal halide gas. When both the sacrificial metal atomic layer and the initial sacrificial metal layer are Al, and $TiCl_4$ gas is used for the metal halide gas, $Al_2Cl_6$ gas is generated by combining Al atoms of the Al layer with Cl atoms of $TiCl_4$, and Ti atoms separated from the $TiCl_4$ gas are deposited on the semiconductor substrate to form a Ti layer. The $Al_2Cl_6$ gas is exhausted from the reaction chamber 51.

Since the Gibbs free energy of $Al_2Cl_6$ is higher than that of $TiCl_4$, as shown in Table 1A, the Al layer reacts with the $TiCl_4$ gas to form the Ti layer. $TaCl_5$ gas, $HfCl_4$ gas, $ZrCl_4$ gas, $TiI_4$ gas, $TaI_5$ gas, $HfI_4$ gas, $ZrI_4$ gas, $TiBr_4$ gas, $TaBr_5$ gas, $HfBr_4$ gas $ZrBr_4$ gas, $TiF_4$ gas, $TaF_5$ gas, $HfF_4$ gas or $ZrF_4$ gas may be used instead of the $TiCl_4$, gas for the metal halide gas. In order to form a Hf layer or a Zr layer using HfCl$_4$ gas or ZrCl$_4$ gas as the metal halide gas, the Al sacrificial metal atomic layer or initial sacrificial metal layer is optimum. This is because the Gibbs free energies of HfCl$_4$ gas and ZrCl$_4$ gas are higher than those of LaCl$_3$ gas, PrCl$_3$ gas, In$_2$Cl$_6$ gas, CeCl$_3$ gas, NdCl$_3$ gas and Be$_2$Cl$_4$ gas, as shown in Table 1A. Also, in order to form a desired metal atomic layer using most of the above described metal halide gases, the Al sacrificial metal atomic layer or initial sacrificial metal layer is most preferable as shown in Tables 2 to 4. It is preferable to perform the step 11 of forming the initial sacrificial metal layer through to the step 19 of forming the metal atomic layer at the same temperature.

Then, H$_2$ remote plasma is injected around the resultant structure where the sacrificial metal layer is formed, from the H$_2$ remote plasma generator 61, to completely remove the remnants of CHx separated from the sacrificial metal source gas and remaining in the chamber (step 20). Here, the H$_2$ remote plasma is generated in a chamber separated from the chamber in which the reaction is performed. Thus, CHx can be removed more completely than in the case of using H$_2$ gas, to thereby form a pure sacrificial metal layer, and thus a pure subsequent metal atomic layer.

Then, the peripheral portion of the resultant structure where the sacrificial metal layer is formed is purged with the inert gas to completely exhaust the sacrificial metal source gas remaining in the reaction chamber 51 (step 25), (a third purge process.) The reducing gas may be supplied during the third purge process. Also, the steps 20 and 25 of injecting the remote plasma and the third purge are performed at the same temperature as the steps 11 to 19 (forming the initial sacrificial metal layer through to forming the metal atomic layer).

After forming the metal atomic layer, the value n is increased by 1 (step 21), and the new n is compared to the initially predetermined number of cycles k (step 23). If the new n value is smaller than the initially predetermined number of cycles k, steps 15 to 25 (forming the sacrificial metal atomic layer through to the third purge) are repeated in sequence until the value n is equal to the number of cycles k, to thereby form a metal layer of the desired thickness on the semiconductor substrate. When the resultant structure where the metal layer is formed is annealed at a predetermined temperature, a metal silicide layer is formed at the interface between an impurity layer and the metal layer. Here, the metal silicide layer is an ohmic layer for improving contact resistance between the metal layer and the impurity layer.

Figure 6:
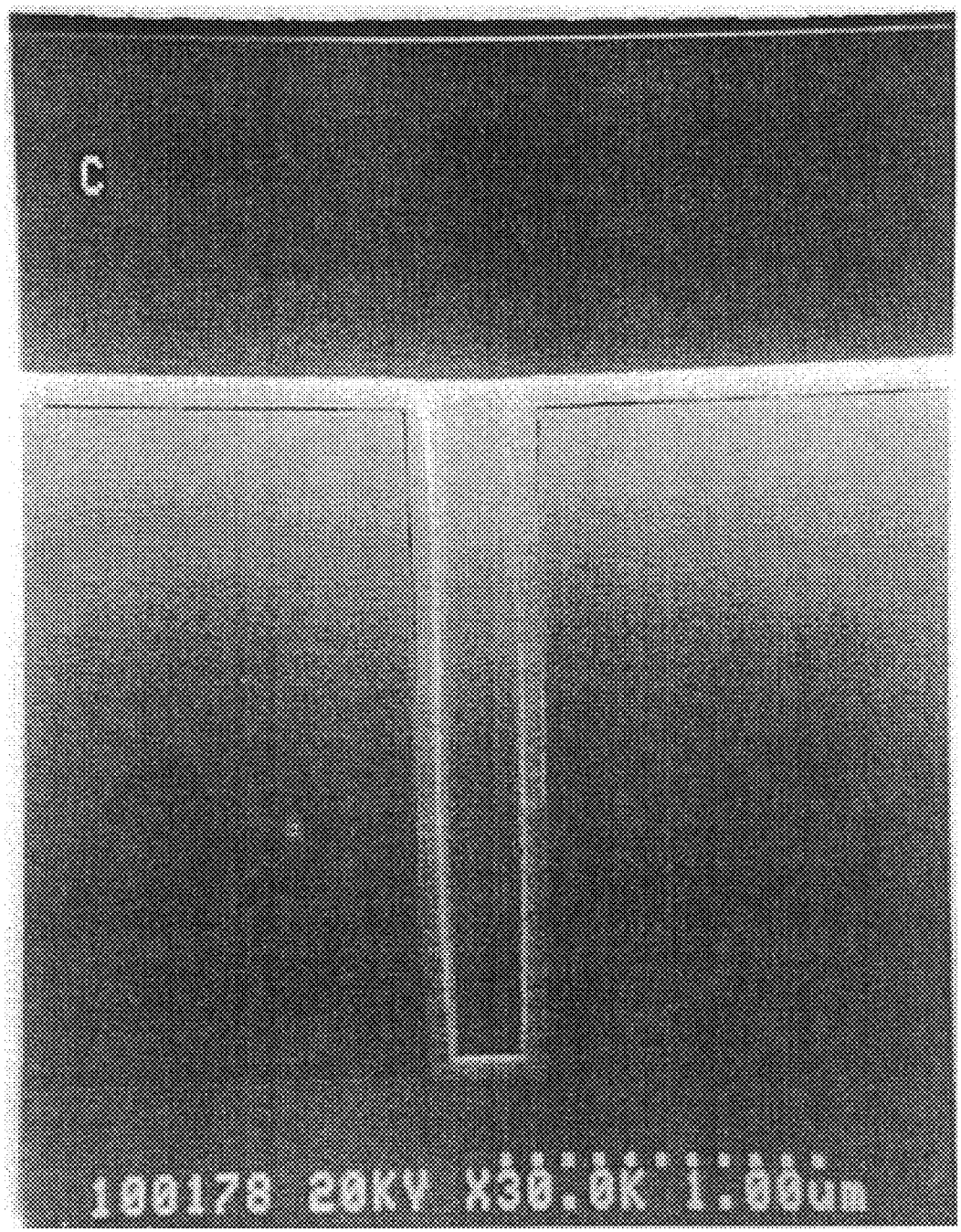
FIG. 6 is a scanning electron microscope (SEM) photograph of a cross-section of a titanium layer according to one embodiment of the present invention.

The Ti layer formed according to one embodiment of the present invention is shown in FIG. 6. In FIG. 6, during the steps of forming the initial sacrificial metal layer through to the third purge, the temperature 'Ts' of the semiconductor substrate was 450° C. The initial sacrificial metal layer was an Al layer formed by reacting TMA gas with H$_2$ gas for about 10 sec. At this time, inert N$_2$ gas was also injected into the reaction chamber. The N$_2$ gas and the H$_2$ gas were injected into the reaction chamber at flow rates of 40 sccm and 1000 sccm, respectively, and the pressure in the reaction chamber was approximately 3 torr. Also, the TMA gas was generated using a bubbler at room temperature. At this time, no carrier gas was used for the TMA gas, so the TMA gas was injected into the reaction chamber by a difference between the vapor pressure of the TMA gas and the pressure in the reaction chamber. After forming the initial sacrificial metal layer (Al layer), the TMA gas supply was stopped, and the first purge process was performed for about 5 sec in order to completely remove the TMA gas remaining in the reaction chamber. At this time, the N$_2$ gas and the H$_2$ gas were continuously injected to keep the pressure in the reaction chamber at approximately 8 torr. Then, after completing the first purge process, TMA gas was injected into the reaction chamber for approximately 1 sec, and thus the H$_2$ gas reacted with the TMA gas to form a thin sacrificial metal atomic layer, i.e., an Al atomic layer. Next, the TMA gas supply was stopped, and the second purge process was performed in the same manner as the first purge process. Then, TiCl$_4$ metal source gas was injected into the reaction chamber for approximately 5 sec. Thus the Al layer and the TiCl$_4$ gas reacted with each other to form a Ti atomic layer on the entire surface of the semiconductor substrate. Subsequently, the steps of the first purge, forming the sacrificial metal atomic layer, the second purge and forming the metal atomic layer were repeated in sequence 50 times.

Referring to FIG. 6, it can be seen that the Ti layer according to one embodiment of the present invention was formed inside the contact hole having an aspect ratio of 5 or higher and on the peripheral portion of the contact hole, to a uniform thickness of approximately 600 Å.

Figure 7:
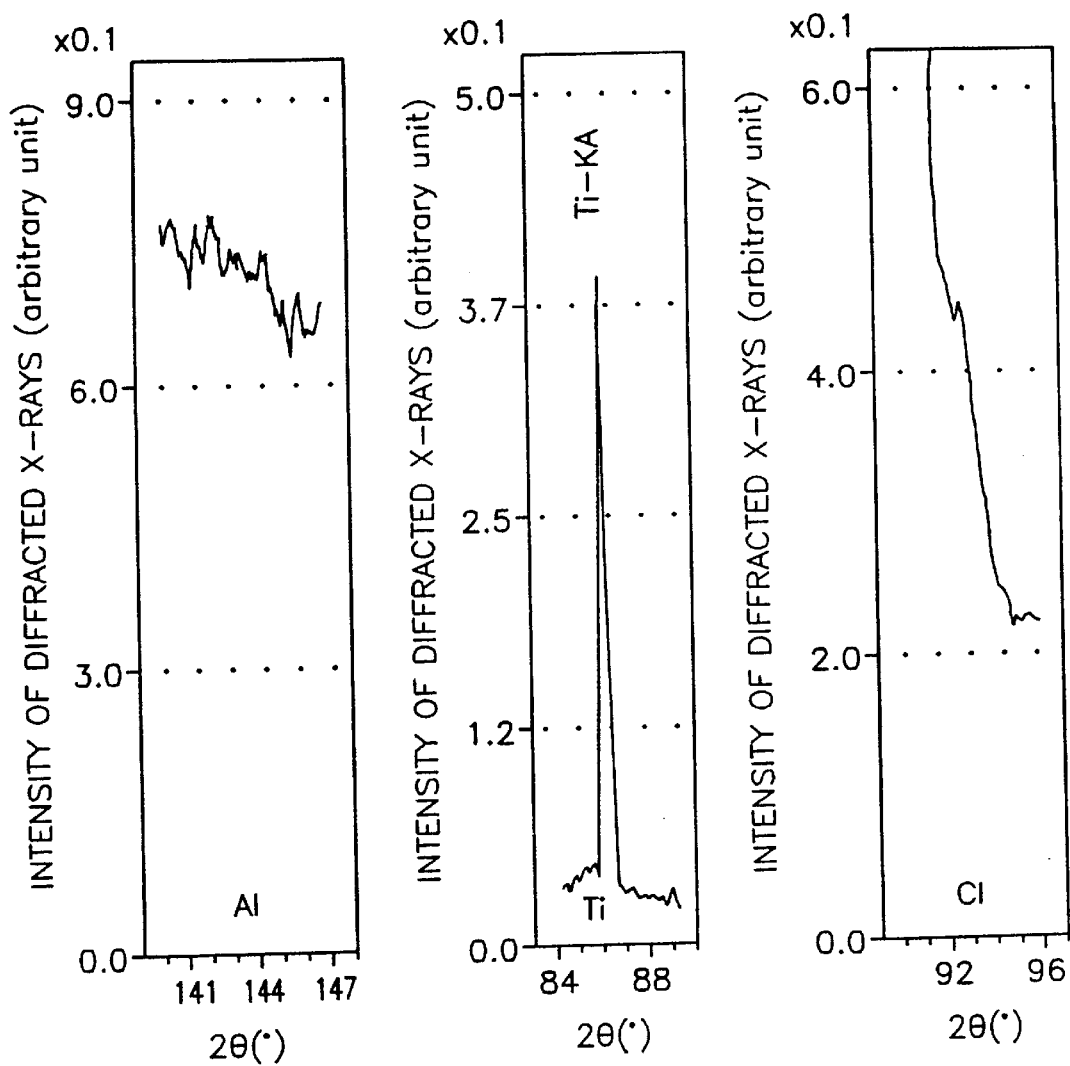
FIG. 7 shows components of the titanium layer of FIG. 6 measured by X-ray fluorescence (XRF) apparatus.

In FIG. 7, the horizontal axis represents a diffraction angle of X-rays, and the vertical axis represents the intensity of the diffracted X-rays in arbitrary units. Also, in the graph, the range of the diffraction angle 2è of the X-rays between 140° and 170° is the result obtained by measuring the Al component, the range between 84° and 89° represents the result obtained by measuring the Ti component, and the range between 90° and 96° represents the result obtained by measuring the Cl component.

It can be seen from FIG. 7 that the Ti layer formed according to one embodiment of the present invention contains no impurities, only Ti atoms.

Figure 3:
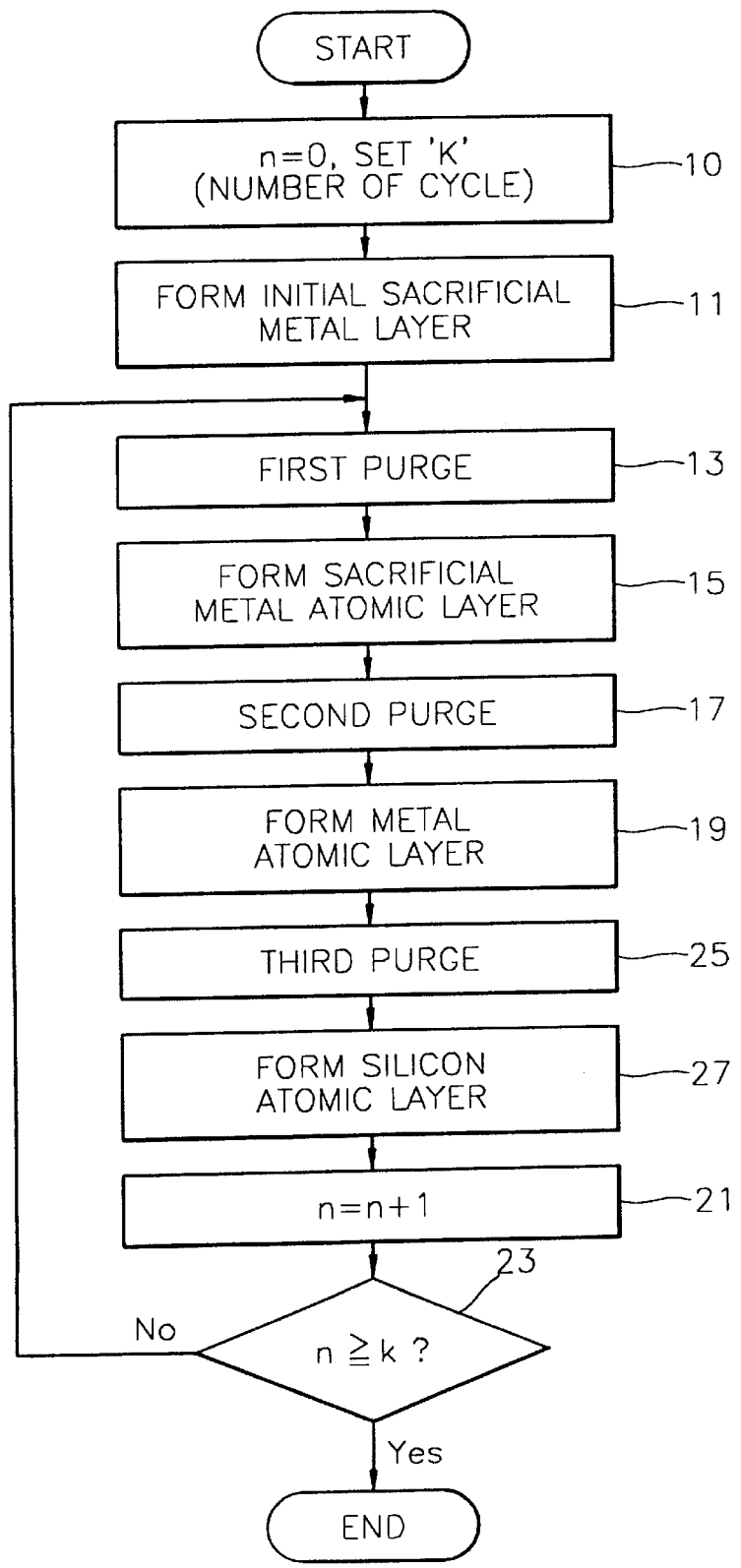
FIG. 3 is a flowchart illustrating the process sequence of another embodiment of the present invention.
Figure 4:
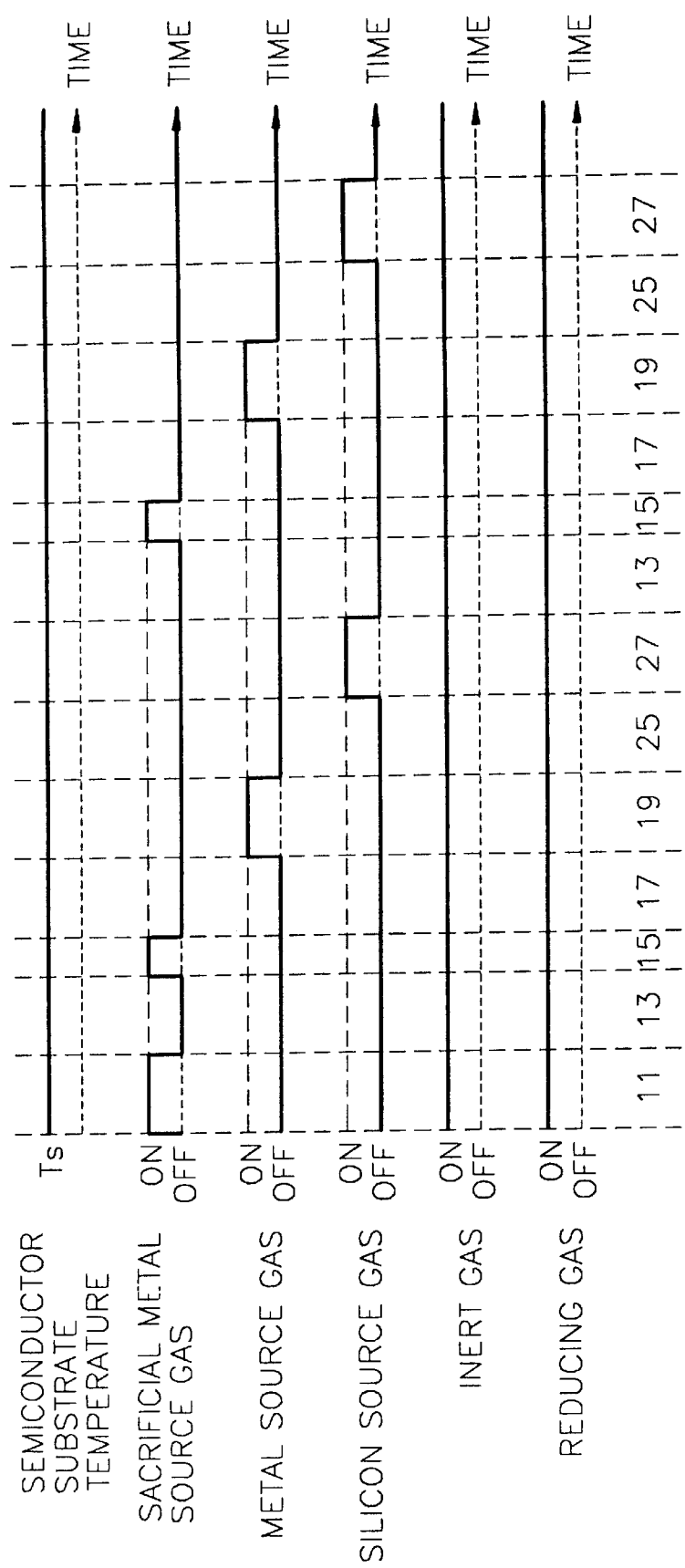
FIG. 4 is a timing diagram illustrating another embodiment of the present invention.

In FIGS. 3 and 4, portions represented by the same reference numerals as in the first embodiment refer to the same procedures.

Referring to FIGS. 3, 4 and 5, after steps 11 to 25 (forming the initial sacrificial metal layer through to the third purge), step 27 of forming a silicon atomic layer is additionally performed, to thereby form a metal silicide layer. The silicon atomic layer is formed on a metal atomic layer by reacting the silicon source gas injected into the reaction chamber 51 after completion of the third purge process 25. At this time, while forming the silicon layer, the temperature of the semiconductor substrate is maintained at the same temperature as in the third purge process 25, i.e., below 500° C., preferably 300~500° C. Like in the first embodiment of the present invention, steps 12 to 27 (injecting H$_2$ remote plasma through to forming the silicon atomic layer) are repeated in sequence, as desired, and thus metal atomic layers and silicon atomic layers are alternately stacked. At this time, the metal atomic layer and the silicon atomic layer react with each other, forming a metal silicide layer. The composition ratio of the metal silicide layer may be changed by controlling the thicknesses of the metal atomic layer and the silicon atomic layer. Preferably, the silicon source gas employs SiH$_4$ gas, Si$_2$H$_6$ gas, $(CH_3)_3$SiC≡CSi(CH)$_3$ gas, ((CH$_3$)$_3$Si)$_2$CH$_2$ gas, (CH$_3$)$_3$CSi(CH$_3$)$_2$ Cl gas, (C$_4$H$_9$)SiCl$_3$ gas, (CH$_3$)$_3$SiN(C$_2$H$_5$)$_2$ gas, (CH$_3$)$_2$SiCl$_2$ gas, ((CH$_3$)$_2$Si—)$_n$ gas, (C$_6$H$_5$)$_2$SiCl$_2$ gas, (C$_6$H$_5$)$_2$SiH$_2$ gas, C$_2$H$_5$SiCl$_3$ gas, Cl$_3$SiSiCl$_3$ gas, (CH$_3$)$_3$SiSi(CH$_3$)$_3$ gas, Ch$_3$SiCl$_2$H gas, (CH$_3$)(C$_6$H$_5$)SiCl$_2$ gas, C$_6$H$_5$SiCl$_3$ gas, SiBr$_4$ gas, SiCl$_4$ gas, SiF$_4$ gas, SiI$_4$ gas, (C$_{32}$H$_{16}$N$_8$)SiCl$_2$ gas, Si(Si(CH$_3$)$_3$)$_4$ gas, Si(CH$_3$)$_4$ gas, CH$_3$SiCl$_3$ gas, HsiCl$_3$ gas, (C$_2$H$_5$)$_3$SiCl gas, CF$_3$Si(CH$_3$)$_3$ gas, (CH$_3$)$_3$SiCl gas, (CH$_3$)$_3$SiH gas, (CH$_3$)$_3$SiC≡CH gas, (C$_5$H$_5$)Si(CH$_3$)$_3$ gas, (C$_5$(CH$_3$)$_5$)Si(CH$_3$)$_3$ gas, (C$_6$H$_5$)$_3$SiCl gas, (C$_6$H$_5$)$_3$SiH gas, ((CH$_3$)$_2$N)$_3$CH gas or CH$_2$=CHSiCl$_3$ gas.

According to another embodiment of the present invention, a desired metal silicide layer, e.g., a TiSi layer, a TaSi layer, a ZrSi layer or a HfSi layer, may be formed according to the type of metal atomic layer. Also, a metal silicide layer having excellent step coverage may be formed in the contact hole having a high aspect ratio.

As described above, according to the present invention, the metal layer or the metal silicide layer having excellent step coverage may be formed in the contact hole having a high aspect ratio. Thus, a metal interconnection appropriate for highly-integrated semiconductor devices may be formed.

The present invention is not limited to the illustrated embodiments, and many changes and modifications can be made within the scope of the invention by a person skilled in the art.

What is claimed is:

1. A method for forming a metal layer, comprising the steps of:
   (a) forming a sacrificial metal atomic layer on a semiconductor substrate;
   (b) removing the sacrificial metal atomic layer and simultaneously forming a metal atomic layer on the semiconductor substrate by reacting the sacrificial metal atomic layer with a metal halide gas; and
   (c) stacking a plurality of metal atomic layers on the semiconductor substrate by alternately forming the sacrificial atomic layer and the metal atomic layer, at least once.

2. The method of claim 1, further comprising the step of forming an initial sacrificial metal layer on the semiconductor substrate before step (a) of forming the sacrificial metal atomic layer.

3. The method of claim 2, wherein while the initial sacrificial metal layer is formed, the semiconductor substrate is heated to 300~500° C.

4. The method of claim 1, wherein while the sacrificial metal atomic layer and the metal atomic layer are formed, the semiconductor substrate is heated to 300~500° C.

5. The method of claim 1, wherein the Gibbs free energy of a composition including a metal atom of the sacrificial metal atomic layer and a halogen atom of the metal halide gas is higher than that of the metal halide.

6. The method of claim 2, further comprising the step of purging the peripheral portion of the resultant structure where the initial sacrificial metal layer is formed, with an inert gas, before step (a) of forming the sacrificial metal atomic layer.

7. The method of claim 1, further comprising the step of purging the peripheral portion of the resultant structure where the sacrificial metal atomic layer is formed, with an inert gas, before step (b) of forming the metal atomic layer.

8. The method of claim 1, further comprising the step of forming an ohmic layer at the interface between the semiconductor substrate and the plurality of metal atomic layers, by reacting the plurality of metal atomic layers with the semiconductor substrate by annealing, after step (c) of stacking the plurality of metal atomic layers.

9. The method of claim 8, wherein the ohmic layer is a metal silicide layer.

10. The method of claim 2, further comprising the step of $H_2$-remote-plasma processing the resultant structure where the initial sacrificial metal layer is formed, to remove remnants separated from a sacrificial metal source, after the step of forming the initial sacrificial metal layer.

11. The method of claim 1, further comprising the step of $H_2$-remote-plasma processing the resultant structure where the sacrificial metal atomic layer is formed, to remove remnants separated from the sacrificial metal source, after the step of forming the sacrificial metal layer.

12. The method of claim 1, further comprising the step of $H_2$-remote-plasma processing the resultant structure where the metal atomic layer is formed, to remove remnants separated from the metal halide gas, after the step of forming the metal atomic layer.

13. The method of claim 12, further comprising the step of purging the peripheral portion of the resultant structure where the metal atomic layer is formed with an inert gas, after the step of $H_2$-remote-plasma processing.

14. A method for forming a metal silicide layer, comprising the steps of:
   forming a sacrificial metal atomic layer on a semiconductor substrate;
   removing the sacrificial metal atomic layer and simultaneously forming a metal atomic layer on the semiconductor substrate by reacting the sacrificial metal atomic layer with a metal halide gas;
   forming a silicon atomic layer on the metal atomic layer; and
   alternately stacking a plurality of metal atomic layers and a plurality of silicon atomic layers on the semiconductor substrate by forming the sacrificial metal atomic layer, the metal atomic layer and the silicon atomic layer in sequence at least once.

15. The method of claim 14, further comprising the step of forming an initial sacrificial metal layer on the semiconductor substrate before the step of forming the sacrificial metal atomic layer.

16. The method of claim 15, wherein while the initial sacrificial metal layer is formed, the semiconductor substrate is heated to 300~500° C.

17. The method of claim 14, wherein while the sacrificial metal atomic layer, the metal atomic layer and the silicon atomic layer are formed, the semiconductor substrate is heated to 300~500° C.

18. The method of claim 14, wherein the Gibbs free energy of a composition consisting of a metal atom of the sacrificial metal atomic layer and a halogen atom of the metal halide gas is higher than that of the metal halide.

19. The method of claim 15, further comprising the step of purging the peripheral portion of the resultant structure where the initial sacrificial metal layer is formed, with an inert gas, before the step of forming the sacrificial metal atomic layer.

20. The method of claim 14, further comprising the step of purging the peripheral portion of the resultant structure where the sacrificial metal atomic layer is formed, with an inert gas, before the step of forming the metal atomic layer.

21. The method of claim 14, further comprising the step of purging the peripheral portion of the resultant structure where the metal atomic layer is formed, with an inert gas, before the step of forming the silicon atomic layer.

22. The method of claim 15, further comprising the step of $H_2$-remote-plasma processing the resultant structure where the initial sacrificial metal layer is formed, to remove remnants separated from a sacrificial metal source, after the step of forming the initial sacrificial metal layer.

23. The method of claim 14, further comprising the step of $H_2$-remote-plasma processing the resultant structure where the sacrificial metal atomic layer is formed, to remove remnants separated from the sacrificial metal source, after the step of forming the sacrificial metal layer.

24. The method of claim 14, further comprising the step of $H_2$-remote-plasma processing the resultant structure where the metal atomic layer is formed, to remove remnants separated from the metal halide gas, after the step of forming the metal atomic layer.

25. The method of claim 14, wherein the silicon atomic layer is formed by reacting a silicon source gas.

* * * * *

UNITED STATES PATENT AND TRADEMARK OFFICE
CERTIFICATE OF CORRECTION

PATENT NO. : 6,174,809 B1  Page 1 of 1
DATED : January 16, 2001
INVENTOR(S) : Sang-bom Kang et al.

It is certified that error appears in the above-identified patent and that said Letters Patent is hereby corrected as shown below:

Column 1,
Line 29, "13~16μU-cm" should read -- 13~16μÙ-cm --;
Line 46, "suicide" should read -- silicide --;
Line 61, "600√ C. or" should read -- 600°C or --;

Column 3,
Line 46, "suicide" should read -- silicide --;

Column 7,
Line 11, "$(c_4H_9)_{3A1H}$, $(c_2H_5)_3A1$" should read -- $(C_4H_9)_3AIH$, $(C_2H_5)_3AI$, --;

Column 9,
Line 5, "$1n_2C1_6$ gas" should read -- $In_2CI_6$ gas --;

Column 10,
Line 56, "$Si_2H_6$ gas, $(CH_3)_3SiC$" should read -- $Si_2H_6$ gas, $(CH_3)_3SiC$ --;
Line 62, "$SiI_4$ gas" should read -- $SiI_4$ gas --.

Signed and Sealed this

Tenth Day of September, 2002

Attest:

JAMES E. ROGAN
Attesting Officer   Director of the United States Patent and Trademark Office